(12) United States Patent
Marais et al.

(10) Patent No.: US 9,006,904 B2
(45) Date of Patent: Apr. 14, 2015

(54) DUAL SIDE PACKAGE ON PACKAGE

(71) Applicant: STMicroelectronics (Grenoble 2) SAS, Grenoble (FR)

(72) Inventors: Dominique Marais, La Terrasse (FR); Jacques Chavade, Moirans (FR); Rémi Brechignac, Grenoble (FR); Eric Saugier, Villard Bonnot (FR); Romain Coffy, Saint Martin le Vinoux (FR); Luc Petit, Fontaine (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 105 days.

(21) Appl. No.: 13/654,850

(22) Filed: Oct. 18, 2012

(65) Prior Publication Data

US 2013/0214425 A1    Aug. 22, 2013

(30) Foreign Application Priority Data

Feb. 17, 2012 (FR) ..................... 12 51504

(51) Int. Cl.
*H01L 23/48* (2006.01)
*H01L 23/52* (2006.01)
(Continued)

(52) U.S. Cl.
CPC ........ *H01L 25/0652* (2013.01); *H01L 23/3677* (2013.01); *H01L 2224/16225* (2013.01); *H01L 2224/32225* (2013.01); *H01L 2224/48227* (2013.01); *H01L 2224/73265* (2013.01); *H01L 2225/0651* (2013.01); *H01L 2225/06517* (2013.01); *H01L 2225/06572* (2013.01); *H01L 2225/06586* (2013.01); *H01L 2225/06589* (2013.01); *H01L 2924/00* (2013.01); *H01L 2924/00012* (2013.01); *H01L 2924/15311* (2013.01); *H01L 2924/3011* (2013.01); *H05K 1/0206* (2013.01); *H05K 3/3436* (2013.01); *H05K 2201/10515* (2013.01); *H05K 2201/1053* (2013.01)

(58) Field of Classification Search
None
See application file for complete search history.

(56) References Cited

U.S. PATENT DOCUMENTS

| 5,798,567 A | 8/1998 | Kelly et al. |
| 2002/0052105 A1 | 5/2002 | Akram |

(Continued)

FOREIGN PATENT DOCUMENTS

| EP | 1189282 A1 | 3/2002 |
| JP | 60127747 A | 7/1985 |

OTHER PUBLICATIONS

INPI Search Report and Written Opinion for FR1251504 mailed Oct. 12, 2012 (9 pages).

*Primary Examiner* — Wensing Kuo
*Assistant Examiner* — Shaka White
(74) *Attorney, Agent, or Firm* — Gardere Wynne Sewell LLP

(57) ABSTRACT

An electronic package includes a substrate wafer with an interconnect network. A first chip is fixed to a front of the substrate, connected to the interconnect network and encapsulated by a body. A second chip is placed on a back side of the substrate wafer and connected to the interconnect network by back-side connection elements interposed between the back side of the substrate and a front side of the second chip. Front-side connection elements are placed on the front side of the substrate and connected to the interconnect network. The connection elements extend beyond the frontal face of the body. The package may be mounted on a board with an interposed thermally conductive material.

12 Claims, 2 Drawing Sheets

(51) Int. Cl.
*H01L 29/40* (2006.01)
*H01L 23/367* (2006.01)
*H01L 25/065* (2006.01)
*H05K 1/02* (2006.01)
*H05K 3/34* (2006.01)

(56) References Cited

U.S. PATENT DOCUMENTS

| | | | |
|---|---|---|---|
| 2002/0180035 A1* | 12/2002 | Huang et al. | 257/706 |
| 2002/0190396 A1* | 12/2002 | Brand | 257/787 |
| 2004/0041249 A1* | 3/2004 | Tsai et al. | 257/686 |
| 2004/0145054 A1* | 7/2004 | Bang et al. | 257/737 |
| 2004/0212970 A1* | 10/2004 | Chen et al. | 361/764 |
| 2004/0233642 A1 | 11/2004 | Ito et al. | |
| 2007/0241441 A1 | 10/2007 | Choi et al. | |
| 2008/0150125 A1* | 6/2008 | Braunisch et al. | 257/712 |
| 2009/0168367 A1* | 7/2009 | Fujii | 361/720 |
| 2010/0315787 A1* | 12/2010 | Li et al. | 361/709 |
| 2011/0074028 A1 | 3/2011 | Pendse | |
| 2011/0176280 A1* | 7/2011 | Lee | 361/721 |

* cited by examiner

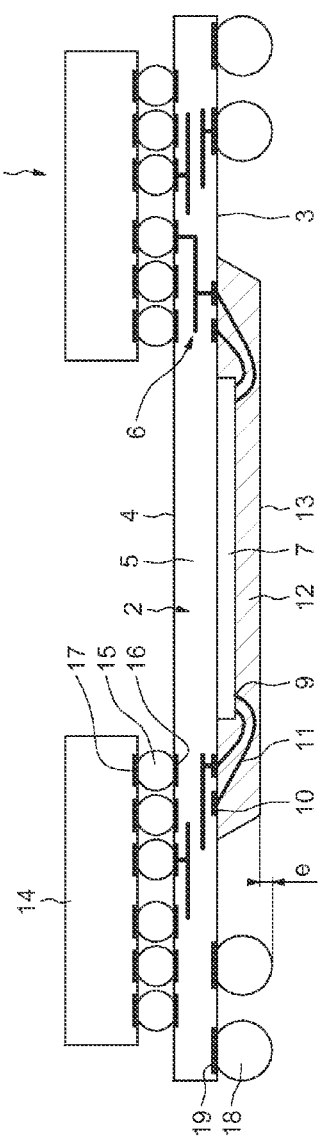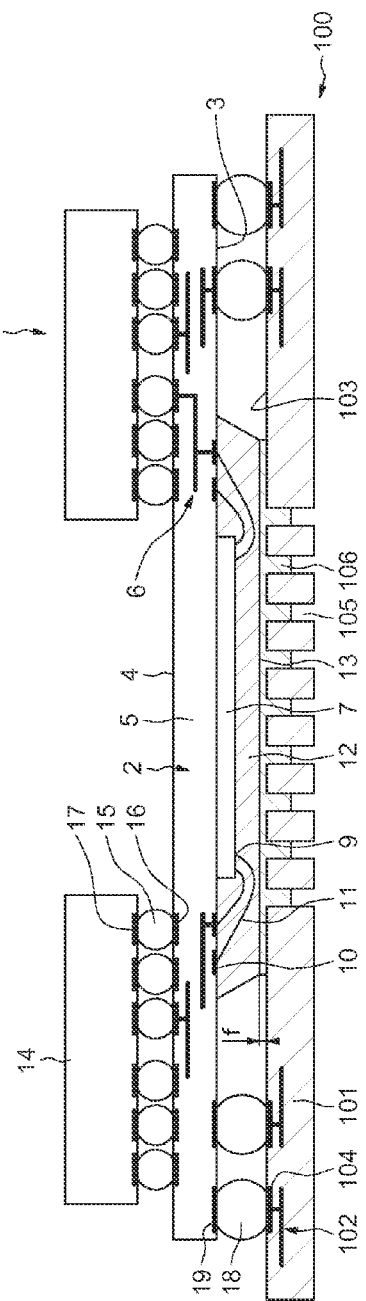

DUAL SIDE PACKAGE ON PACKAGE

PRIORITY CLAIM

This application claims priority from French Application for Patent No. 1251504 filed Feb. 17, 2012, the disclosure of which is hereby incorporated by reference.

TECHNICAL FIELD

The present invention relates to the field of electronic packages including integrated-circuit chips.

BACKGROUND

It is common to mount integrated-circuit chips for processing signals, such as chips including processing units for decoding video signals, on large boards including electrical connection networks and to mount integrated-circuit memory chips on these boards near said signal processing chips, these memory chips being connected to the signal processing chips by way of the electrical connection networks of the boards. In the case where, in particular due to the amount of memory necessary, a number of memory chips need to be connected to a signal processing chip, the quantity of electrical connections required between these chips means that the electrical connection network of the board must comprise a number of metallization levels, generally four, and include, to provide crossovers, via-comprising bridges between these levels. Such a layout makes it difficult to manufacture the board and increases the cost of the latter. In addition, the interconnects between the memory and the processing circuits are subjected to numerous routing constraints related to the high signal frequency, to the existence of differential pairs, to control of impedances and to connection length. Furthermore, the dissipation of the heat produced is a problem There is a need in the art to alleviate the above drawbacks.

SUMMARY

Thus, an electronic package is provided, which package comprises a substrate wafer including an electrical interconnect network interconnecting one side of the substrate wafer to the other; at least one first integrated-circuit chip fixed to a front side of the substrate wafer and connected to said interconnect network by electrical connection wires; a body encapsulating said first chip and the electrical connection wires on the front side of the substrate wafer, this encapsulating body having a frontal face that lies parallel to the substrate wafer; at least one second integrated-circuit chip placed on a back side of the substrate wafer and connected to said interconnect network by way of back-side electrical connection elements interposed between the back side of the substrate wafer and a front side of the second chip; and a plurality of front-side electrical connection elements that are placed on the front side of the substrate wafer on its periphery at a distance away from said encapsulating body, and that are connected to said interconnect network, said front-side electrical connection elements extending frontwards beyond the frontal face of said encapsulating body.

The frontal face of said encapsulating body may be covered with a thermally conductive material.

The frontal face of said encapsulating body may comprise asperities or surface irregularities.

According to a variant embodiment the first integrated-circuit chip may comprise at least one signal-processing unit and the second integrated-circuit chip may comprise at least one memory unit.

An electronic device is also provided, which device comprises a package such as described above and a circuit board having a mounting side and equipped with an electrical connection network, in which the front-side electrical connection elements are connected to this electrical connection network on said mounting side of the circuit board and the frontal face of the encapsulating body is at a distance away from this mounting side, and in which a thermally conductive material is interposed between the encapsulating body and the circuit board.

Furthermore, an electronic device is provided that comprises a circuit board having a mounting side and equipped with an electrical connection network and that comprises an electronic package comprising a substrate wafer including an electrical interconnect network, at least one first integrated-circuit chip fixed to a front side of the substrate wafer and connected to said interconnect network by electrical connection wires, a body encapsulating said first chip on the front side of the substrate wafer, a plurality of front-side electrical connection elements that are placed between the front side of the substrate wafer, on its periphery at a distance away from said encapsulating body, and a mounting side of the circuit board. In this electronic device, a frontal face of the encapsulating body, lying parallel to the substrate wafer, is at a distance away from the mounting side of the circuit board and a thermally conductive material is interposed between the encapsulating body and the circuit board.

The thermally conductive material may be interposed between the front side of the substrate wafer and the circuit board, thereby embedding the front-side electrical connection elements.

The circuit board may comprise a number of through-holes located facing the frontal face of the encapsulating body, the thermally conductive material at least partially filling these through-holes and the space between the frontal face of the encapsulating body and the mounting side of the circuit board.

The thermally conductive material may for example be a thermal paste.

BRIEF DESCRIPTION OF THE DRAWINGS

An electronic package and an electronic device will now be described by way of non-limiting examples, the description being illustrated by the drawings in which:

FIG. 1 shows a cross section through an electronic package;

FIG. 2 shows a cross section through an electronic device including the electronic package in FIG. 1.

DETAILED DESCRIPTION OF THE DRAWINGS

Figure 3:
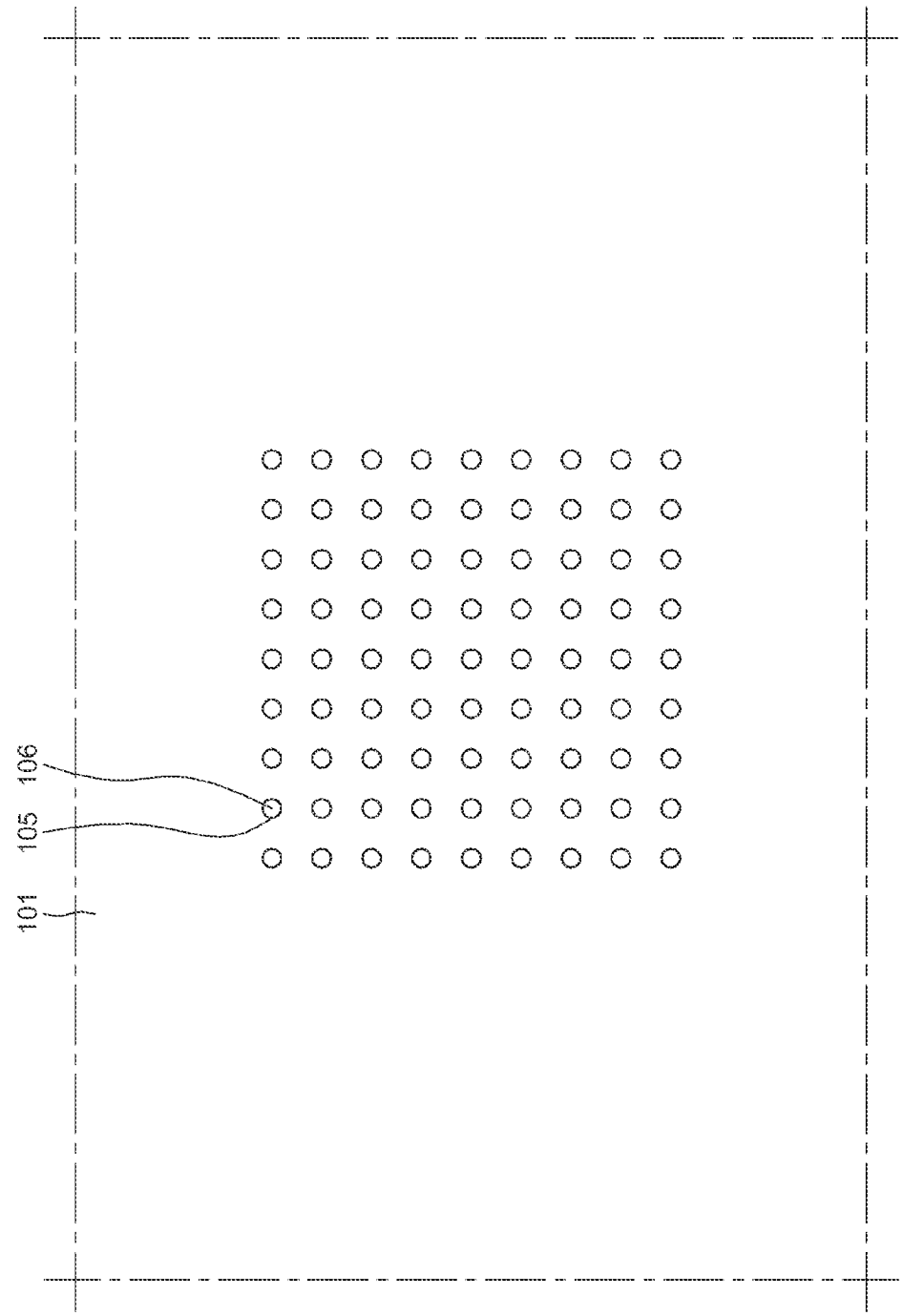
FIG. 3 shows the electronic device viewed from the side opposite said electronic package.

The electronic package 1 illustrated in FIG. 1 comprises a substrate wafer 2 having a front side 3 and a back side 4 and including, in an insulating material 5, an electrical network 6 interconnecting one side of the substrate wafer with the other.

The electronic package 1 comprises a first integrated-circuit chip 7 a back side of which is fixed to the central part of the front side 3 of the substrate wafer 2 by way of an adhesive layer (not shown). Electrical connection pads 9 arranged on a front side of the chip 7 are connected to front-side electrical connection pads 10 of the interconnect network 6, which pads are arranged on the front side 3 of the substrate wafer 2, by way of electrical connection wires 11, by soldering of the ends of these wires 11. These electrical connection wires 11 may be arranged in two layers.

The electronic package 1 comprises an encapsulating body 12, for example made of an epoxy resin and obtained by counter molding, formed on the front side 3 of the substrate wafer 2 and in which the chip 7 and the electrical connection wires 11 are embedded, this encapsulating body 12 having a frontal face 13 lying parallel to the front side 3 of the substrate wafer 2.

The electronic package 1 furthermore comprises two second integrated-circuit chips 14 and back-side electrical connection elements 15, such as bumps, which elements are interposed between the back side 4 of the substrate wafer and a front side of the second chips 14. Back-side electrical connection pads 16 of the interconnect network 6 are arranged on the back side 4 of the substrate wafer 2 and are soldered to the back-side electrical connection elements 15, and front-side electrical connection pads 17 are provided on the front sides of the second chips 14 and are soldered to the back-side electrical connection elements 15.

The electronic package 1 furthermore comprises a number of front-side electrical connection elements 18 placed on the front side 3 of the substrate wafer 2 on its periphery and at a distance away from the encapsulating body 12 and on front-side pads 19 of the interconnect network 6. These front-side electrical connection elements 18 extend frontwards beyond the plane comprising the frontal face 13 of the encapsulating body 12, with a gap e, and may be formed by bumps or columns.

FIG. 2 illustrates an electronic device 100 that comprises a board 101 including an electrical connection network 102 and on which the electronic package 1 is mounted.

The electronic package 1 is placed in a position such that the frontal face 13 of the encapsulating body 12 is located at a distance f away from and parallel to a mounting side 103 of the circuit board 101, whereas the front-side electrical connection elements 18 are soldered to electrical connection pads 104 of the electrical connection network 102, which pads are arranged on the side 103 of the circuit board 101.

As illustrated in FIGS. 2 and 3, the circuit board 101 comprises a number of through-holes 105 located in a zone opposite the encapsulating body 12, these through-holes 105 for example being obtained by drilling and for example being arranged in a matrix.

The electronic device 100 furthermore comprises a thermally conductive material 106 that at least partially fills the space between the frontal face 13 of the encapsulating body 12 and the mounting side 103 of the board 101, and at least partially fills the through-holes 105. The thermally conductive material 106 could also at least partially fill the space between the front side 3 of the substrate wafer 2 and the side 103 of the board 101, thereby embedding the front-side electrical connection elements 18. For example, the thermally conductive material 105 may be a thermal paste optionally comprising a metal particle filler. Thus, the heat produced, especially by the chip 7, may be dissipated through the circuit board 101 so as to be removed.

In order to improve heat exchange, the frontal face 13 of the encapsulating body 12 may be covered with a metal layer and/or comprise means for enlarging the heat exchange surface such as asperities and/or surface irregularities, taking the form of grooves or ribs, obtained directly during the molding of the encapsulating body 12.

According to one exemplary application, the first integrated-circuit chip 7 may comprise at least one signal processing unit and the second integrated-circuit chips 14 may comprise at least one memory unit, in particular for processing video signals.

Because the chips 7 and 14 are borne by a substrate wafer 2 with a smaller area than that of the circuit board 101, the package 1 may be manufactured to a tailored specification that allows the electrical characteristics of the electrical interconnect network 6 of the substrate wafer 2 to be controlled, especially with the aim of meeting the demanding length and impedance constraints on the connections between the chips 7 and 14 made via this network 6, the manufacture of the electrical connection network 102 of the circuit board 101 then no longer being subject to these constraints. For example, the electrical interconnect network 6 of the substrate wafer 2 may be produced in four metallization levels whereas the electrical connection network 102 of the circuit board 101 may be produced in one or two metallization levels. Thus, the electronic device 100 may be obtained at an advantageous price.

According to a variant embodiment, the chips 14 could be omitted.

The present invention is not limited to the examples described above. Other variant embodiments are possible, without departing from the scope defined by the appended claims.

What is claimed is:

1. An electronic device, comprising:
    a package comprising:
        a substrate wafer including an electrical interconnect network interconnecting a front side of the substrate wafer to a back side;
        at least one first integrated-circuit chip fixed to the front side of the substrate wafer and connected to said interconnect network by electrical connection wires;
        a body encapsulating said first integrated-circuit chip and the electrical connection wires on the front side of the substrate wafer, this encapsulating body having a frontal face that lies parallel to the substrate wafer and includes asperities or surface irregularities;
        at least one second integrated-circuit chip placed on the back side of the substrate wafer and connected to said interconnect network by way of back-side electrical connection elements interposed between the back side of the substrate wafer and a front side of the second integrated-circuit chip; and
        a plurality of front-side electrical connection elements that are placed on the front side of the substrate wafer on its periphery at a distance away from said encapsulating body, and that are connected to said interconnect network, said front-side electrical connection elements extending frontwards beyond the frontal face of said encapsulating body;
    a circuit board having a mounting side and equipped with an electrical connection network and a number of through-holes located facing the frontal face of the encapsulating body, wherein the front-side electrical connection elements are connected to this electrical connection network on said mounting side of the circuit board and the frontal face of the encapsulating body is at a distance away from this mounting side;
    a thermally conductive paste material interposed between the encapsulating body and the mounting side of the circuit board, the thermally conductive paste material conformable to at least partially fill the number of through-holes and fill the asperities or surface irregularities.

2. The device according to claim 1, wherein the first integrated-circuit chip comprises at least one signal-processing unit and the second integrated- circuit chip comprises at least one memory unit.

3. The device according to claim 1, wherein the thermally conductive paste material at least partially filling the space between the frontal face of the encapsulating body and the mounting side of the circuit board.

4. An electronic device, comprising:
a circuit board having a mounting side and equipped with a first electrical connection network; and
an electronic package comprising:
a substrate wafer including a second electrical interconnect network;
at least one first integrated-circuit chip fixed to a front side of the substrate wafer and connected to said second interconnect network by electrical connection wires;
a body encapsulating said first integrated-circuit chip on the front side of the substrate wafer; and
a plurality of front-side electrical connection elements that are placed between the front side of the substrate wafer, on its periphery at a distance away from said encapsulating body, and a mounting side of the circuit board;
wherein a frontal face of the encapsulating body, lying parallel to the substrate wafer, is at a distance away from the mounting side of the circuit board and comprises asperities or surface irregularities; and
wherein a thermally conductive paste material is interposed between the encapsulating body and the circuit board, the thermally conductive paste material moldable to at least partially fill the space between the encapsulating body and the circuit board and fill said asperities or surface irregularities.

5. The device according to claim 4, wherein the circuit board comprises a number of through-holes located facing the frontal face of the encapsulating body, the thermally conductive paste material at least partially filling these through-holes of the circuit board.

6. The device according to claim 4, further comprising at least one second integrated-circuit chip placed on the back side of the substrate wafer and connected to said second interconnect network by way of back-side electrical connection elements interposed between the back side of the substrate wafer and a front side of the second integrated-circuit chip.

7. An electronic device, comprising:
a package comprising:
a substrate wafer including an electrical interconnect network interconnecting a front side of the substrate wafer to a back side;
at least one first integrated-circuit chip fixed to the front side of the substrate wafer and connected to said interconnect network by electrical connection wires;
a body encapsulating said first integrated-circuit chip and the electrical connection wires on the front side of the substrate wafer, this encapsulating body having a frontal face opposing the front side of the substrate wafer, the frontal face of the encapsulating body having asperities or surface irregularities disposed therein; and
a plurality of front-side electrical connection elements that are placed on the front side of the substrate wafer on its periphery at a distance away from said encapsulating body, and that are connected to said interconnect network, said front-side electrical connection elements extending frontwards beyond the frontal face of said encapsulating body;
a circuit board having a mounting side and equipped with an electrical connection network and a number of through-holes located facing the frontal face of the encapsulating body, wherein the front-side electrical connection elements are connected to this electrical connection network on said mounting side of the circuit board and the frontal face of the encapsulating body is at a distance away from this mounting side;
a moldable, thermally conductive paste material interposed between the encapsulating body and the mounting side of the circuit board; and
wherein the circuit board comprises a number of through-holes located facing the frontal face of the encapsulating body, the thermally conductive paste material at least partially filling these through-holes and the space between the frontal face of the encapsulating body and the mounting side of the circuit board.

8. The device according to claim 7, wherein the asperities or surface irregularities are filled by said thermally conductive paste.

9. The device according to claim 7 further comprising at least one second integrated-circuit chip placed on the back side of the substrate wafer and connected to said interconnect network by way of back-side electrical connection elements interposed between the back side of the substrate wafer and a front side of the second integrated-circuit chip.

10. The device according to claim 9, wherein the first integrated-circuit chip comprises at least one signal-processing unit and the second integrated- circuit chip comprises at least one memory unit.

11. The device according to claim 7, wherein the asperities or surface irregularities take the form of grooves or ribs.

12. The device according to claim 7, wherein the asperities or surface irregularities take the shape of grooves or ribs formed during a process of molding the encapsulating body.

* * * * *